United States Patent
Youn et al.

(10) Patent No.: US 8,890,197 B2
(45) Date of Patent: Nov. 18, 2014

(54) LIGHT EMITTING DIODES AND METHODS OF FABRICATING THE SAME

(71) Applicant: Electronics and Telecommunications Research Institute, Daejeon (KR)

(72) Inventors: Doo Hyeb Youn, Daejeon (KR); Choon Gi Choi, Daejeon (KR); Kwang Hyo Chung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/830,148

(22) Filed: Mar. 14, 2013

(65) Prior Publication Data

US 2014/0124799 A1     May 8, 2014

(30) Foreign Application Priority Data

Nov. 7, 2012    (KR) .................. 10-2012-0125488

(51) Int. Cl.
*H01L 33/00* (2010.01)
*H01L 33/08* (2010.01)
*H01L 33/48* (2010.01)

(52) U.S. Cl.
CPC ............ *H01L 33/48* (2013.01); *H01L 33/08* (2013.01)
USPC .......................... 257/98; 257/99; 257/100

(58) Field of Classification Search
USPC ............................................. 257/98, 99, 100
See application file for complete search history.

(56) References Cited

U.S. PATENT DOCUMENTS

| 2009/0071533 | A1 | 3/2009 | Choi et al. |
| 2011/0203924 | A1* | 8/2011 | Wohlstadter et al. ..... 204/403.01 |
| 2011/0269642 | A1* | 11/2011 | Glezer et al. .................... 506/9 |
| 2012/0141799 | A1* | 6/2012 | Kub et al. ...................... 428/408 |
| 2012/0314726 | A1* | 12/2012 | Lee et al. .................... 372/44.01 |
| 2013/0048339 | A1* | 2/2013 | Tour et al. ................... 174/126.1 |
| 2013/0149605 | A1* | 6/2013 | Kakehata et al. ............. 429/211 |
| 2013/0255764 | A1* | 10/2013 | Naito et al. .................. 136/256 |

FOREIGN PATENT DOCUMENTS

KR    10-2012-0042777 A    5/2012

OTHER PUBLICATIONS

Gunho Jo, et al., "Large-scale patterned multi-layer graphene films as transparent conducting electrodes for GaN light-emitting diodes", Nanotechnology, 2010, pp. 1-6, vol. 21.

* cited by examiner

*Primary Examiner* — Bilkis Jahan (57) ABSTRACT

Provided is a light emitting diode, including a sub-mount structure including a first substrate and electrode portions provided on the first substrate, and a light emitting structure mounted on the sub-mount structure to include a first semiconductor layer, a second semiconductor layer, and an active layer between the first semiconductor layer and the second semiconductor layer. The electrode portions may include a first electrode portion and a second electrode portion connected to the first and second semiconductor layers, respectively, and each of the first and second electrode portions may include a first metal layer, a graphene layer, and a second metal layer sequentially provided on the first substrate.

7 Claims, 12 Drawing Sheets

LIGHT EMITTING DIODES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2012-0125488, filed on Nov. 7, 2012, in the Korean Intellectual Property Office, the entire contents of which are hereby incorporated by reference.

BACKGROUND OF THE INVENTION

Example embodiments of the inventive concept relate to a light emitting diode, and in particular, to a flip-chip light emitting diode with a sub-mount and a method of fabricating the same.

A light emitting diode (LED), one of P-N junction diodes, is a semiconductor device, which is configured to emit monochromatic light under a forward bias condition using an electroluminescence effect, and a wavelength of light to be emitted therefrom is determined a bandgap energy (Eg) of a material used in the LED. Infrared and red LEDs have been mainly used in an initial stage of LED technology, until the fact that a blue LED can be realized using GaN was shown by Shuji Nakamura of Nichia Chemical Industries Ltd., in 1993. The GaN-based blue LED, in conjunction with the previously-prepared red and green LEDs, enables to realize a white LED, in that white color can be realized by combining red, green and blue lights.

To increase marketability of an LED device, it is necessary to increase a light emitting efficiency and a lifetime of the LED device. However, due to a difference in refractive index between GaN and air, only a portion of light generated in an active layer can be emitted to the outside. Accordingly, most of blue LEDs have an external quantum efficiency of about 54%, but several technologies are being suggested to increase the light emitting efficiency of LEDs.

Graphene, a carbon allotrope, is a two-dimensional atomic-scale honeycomb lattice made of sp2 bonded carbon atoms. The graphene has a very stable chemical structure and a very high mobility (e.g., higher than that of silicon by about 100 times or more). Further, the graphene has high optical transmittance and excellent thermal/mechanical properties. Accordingly, various researches are being conducted to utilize the technical merits of graphene.

SUMMARY

Example embodiments of the inventive concept provide a light emitting diode with improved light-emitting and heat-dissipating efficiency.

Other example embodiments of the inventive concept provide an LED device, in which a graphene layer is used as an electrode, and its fabricating method capable of preventing the graphene layer from being damaged.

According to example embodiments of the inventive concepts, a light emitting diode (LED) may include a sub-mount structure including a first substrate and electrode portions provided on the first substrate, and a light emitting structure mounted on the sub-mount structure to include a first semiconductor layer, a second semiconductor layer, and an active layer between the first semiconductor layer and the second semiconductor layer. The electrode portions include a first electrode portion and a second electrode portion connected to the first and second semiconductor layers, respectively, and each of the first and second electrode portions may include a first metal layer, a graphene layer, and a second metal layer sequentially provided on the first substrate.

In example embodiments, the light emitting structure may further include a second substrate on the first semiconductor layer, and an upper portion of the second substrate may be formed to have concavo-convex patterns.

In example embodiments, the light emitting structure may further include an electrode connecting portion connecting a bottom surface of the first semiconductor layer to the first electrode portion.

In example embodiments, the second metal layer may be a mesh-shaped transparent electrode.

In example embodiments, the second metal layer may be thinner than the first metal layer.

In example embodiments, the light emitting structure may include a plurality of light emitting structures, the first semiconductor layers of the plurality of the light emitting structures may be connected in common to the first electrode portion, the second semiconductor layers of the plurality of the light emitting structures may be connected in common to the second electrode portion.

In example embodiments, the sub-mount structure may further include connection pads extending from the first and second electrode portions, respectively.

According to example embodiments of the inventive concepts, a method of fabricating a light emitting diode may include sequentially forming a first metal layer, a graphene layer, and a second metal layer on a first substrate to form a sub-mount including a first electrode portion and a second electrode portion spaced apart from each other, and mounting a light emitting structure with an active layer on the sub-mount in a flip-chip manner.

In example embodiments, the forming of the graphene layer may include performing a chemical vapor deposition process, in which the first metal layer may be used as a catalysis layer.

In example embodiments, the forming of the graphene layer may further include a cooling process that may be performed after the chemical vapor deposition process.

In example embodiments, the forming of the second metal layer may include providing a shadow mask on the first substrate, and performing an electro-spinning or electro-spraying process to provide solution on the first substrate exposed by the shadow mask.

In example embodiments, the solution contains metal particles and solvent and has viscosity of about 10-50 cPs.

In example embodiments, the light emitting structure may be formed by: sequentially forming a first semiconductor layer, the active layer, and a second semiconductor layer on a second substrate, patterning the second semiconductor layer and the active layer to expose a portion of the first semiconductor layer, and forming an electrode connecting portion on the exposed portion of the first semiconductor layer.

In example embodiments, the mounting the light emitting structure on the sub-mount may include disposing the electrode connecting portion on the first electrode portion and disposing at least a portion of the second semiconductor layer on the second electrode portion.

In example embodiments, the mounting of the light emitting structure on the sub-mount may further include performing a thermal treatment process after disposing the light emitting structure on the sub-mount.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4A through 9A are plan views illustrating a method of fabricating an LED device, according to example embodiments of the inventive concept.

FIGS. 4B through 9B are sectional views taken along lines I-I' of FIGS. 4A through 9A, respectively.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
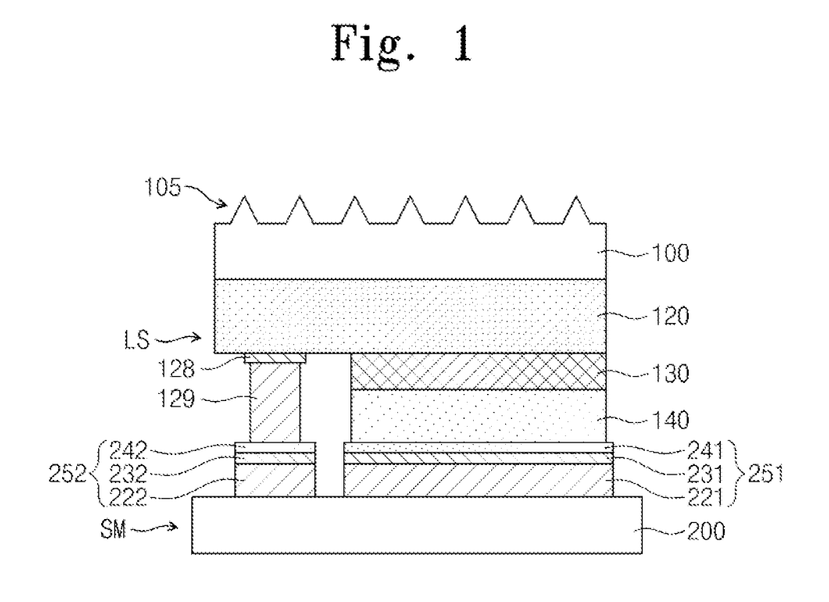
FIG. 1 is a sectional view illustrating an LED device according to example embodiments of the inventive concept.

FIG. 1 is a sectional view illustrating an LED device according to example embodiments of the inventive concept.

Referring to FIG. 1, provided is a sub-mount SM with a first substrate 200 and electrode portions on the first substrate 200. The first substrate 200 may be, for example, a semiconductor substrate or a silicon-on-insulator (SOI) substrate including a semiconductor substrate and an oxide layer thereon.

The electrode portions may include a first electrode portion 252 and a second electrode portion 251. The first electrode portion 252 may include a first metal layer 222, a graphene layer 232, and a second metal layer 242 that are sequentially provided on the first substrate 200. The second electrode portion 251 may include a first metal layer 221, a graphene layer 231, and a second metal layer 241 that are sequentially provided on the first substrate 200. The first metal layers 221 and 222 may contain, for example, nickel (Ni) or copper (Cu). The graphene layers 231 and 232 may be a carbon allotrope and be two-dimensional atomic-scale honeycomb lattice made of sp2 bonded carbon atoms. Each of the graphene layers 231 and 232 may be a single layer of carbon atoms, but be constituted by 2-4 layers of carbon atoms, depending on a fabricating method. The second metal layers 241 and 242 may include at least one of, for example, zinc (Zn), indium (In), titanium (Ti), tin (Sn), copper (Cu), or antimony (Sb).

The second metal layers 241 and 242 may be thinner than the first metal layers 221 and 222. For example, the second metal layers 241 and 242 may have a thickness that is less than one-fourth of that of the first metal layers 221 and 222. In example embodiments, the second metal layers 241 and 242 may include metal wires that are stacked to form a mesh-shape. The second metal layers 241 and 242 may be substantially transparent, due to the relatively small thickness and the mesh-shaped structure.

A light emitting structure LS may be provided on the sub-mount SM. The light emitting structure LS may include a second substrate 100, an active layer 130 between the second substrate 100 and the sub-mount SM, a first semiconductor layer 120 between the active layer 130 and the second substrate 100, and a second semiconductor layer 140 spaced apart from the first semiconductor layer 120 with the active layer 130 interposed therebetween.

The second substrate 100 may be, for example, a sapphire substrate. The second substrate 100 may include concavo-convex patterns 105 provided thereon. The concavo-convex patterns 105 may contribute to increase external emission efficiency of light generated from the active layer 130.

The first semiconductor layer 120 may be an n-type clad layer. For example, the first semiconductor layer 120 may be an n-type $Ga_xN_{1-x}$ layer ($0<x<1$). The active layer 130 may include a multi quantum well (MQW). The multi-quantum well may be configured to emit photons generated by recombination of electrons and holes. For example, the active layer 130 may be an $In_xGa_{1-x}N$ layer ($0 \le x<1$). The second semiconductor layer 140 may be a p-type clad layer. For example, the second semiconductor layer 140 may be a p-type $Ga_xN_{1-x}$ layer ($0<x<1$). A buffer layer (not shown) may be provided between the first semiconductor layer 120 and the second substrate 100. The buffer layer may serve as a seed layer for forming the first semiconductor layer 120. For example, the buffer layer may include at least one of $Al_xN_{1-x}$ ($0<x<1$), $Al_xGa_yN_{1-x-y}$ ($0<x<1$ and $0<y<1$), $Ga_xN_{1-x}$ ($0<x<1$), or $In_xGa_yN_{1-x-y}$ ($0<x<1$ and $0<y<1$). In this specification, subscripts x and y are used to express possible chemical compositions of materials.

The first semiconductor layer 120 may have a bottom surface that is partially exposed, and an electrode connecting portion 129 may be provided to connect electrically the exposed bottom surface of the first semiconductor layer 120 to the first electrode portion 252. The electrode connecting portion 129 may be a pillar or solder ball that is formed of a conductive material. A connection pad 128 may be provided between the electrode connecting portion 129 and the first semiconductor layer 120. For example, the electrode connecting portion 129 and the connection pad 128 may include at least one of Ag, Al, Au, Pd, Ni, Zn, Mo, W, Cr, Ti, Eu, Pt, or Mn.

A bottom surface of the second semiconductor layer 140 may be connected to the second electrode portion 251. Light emitted from the active layer 130 may pass through directly the first semiconductor layer 120 and the second substrate 100 and be emitted to the outside through a top surface of the LED. A portion of light generated in the active layer 130 may pass through the second semiconductor layer 140, the second metal layer 241, and the graphene layer 231, and be reflected by the first metal layer 221, and be then emitted to the outside through a top surface of the LED device.

The second metal layer 241 and the graphene layer 231 may be substantially transparent enough to prevent the light generated in the active layer 130 from being scattered. As described above, the second metal layer 241 may be substantially transparent, due to the relatively small thickness and the mesh-shaped structure thereof. Similarly, due to the small thickness of the graphene layer 231, the graphene layer 231 may have a high optical transmittance (especially, in the ultraviolet range). In general, an indium-tin-oxide (ITO) layer, one of materials for a transparent electrode, suffers from low transmittance to ultraviolet light having a wavelength of about 300-400 nm. By contrast, the graphene layer 231 may provide an optical transmittance of 70% or more to the ultraviolet light. The first metal layer 221 may be formed to have a thickness relatively greater than that of the second metal layer 241, and thus, most of the light from the active layer 130 may be reflected.

A sapphire substrate and a GaN layer have differences of 13% and 34% in lattice constant and thermal expansion coefficient. This means that a p-type GaN layer, the last epitaxial layer grown from the substrate, may have a surface with many crystal defects. Such crystal defects may have a deep level that is different from other portions of the GaN layer, and thus, other portions of the GaN layer may exhibit a different material property from a normal GaN layer. Further, such crystal defects may serve as a direct path of electric current, when they are abruptly applied with high reverse bias. Accordingly, the crystal defects may result in deterioration of an electrostatic breakdown voltage or of electric characteristics such as parasitic resistance and leakage current. According to a conventional process of growing the p-type GaN, Mg, one of dopants, and $H_2$, a carrier gas, may be combined with each other to form Mg—H complex. To avoid this problem, a thermal treatment process may be performed to activate Mg independently, but a doping concentration of Mg activated by this method is lower than that in the conventional process. Accordingly, the p-type GaN layer may have an increased resistance, and this may result in deterioration of a current spreading property of the p-type GaN layer.

The graphene layer 231 has an electric resistivity that is relatively much lower than that of a conventional metal layer. Due to the low resistivity of the graphene layer 231, it is possible to supply electric current uniformly to the whole region of the second semiconductor layer 140. This enables to prevent a current crowding effect in the LED device and consequently to improve a light emitting efficiency of the LED device.

The graphene layer 231 may have a thermal conductivity of about 4800-5300 W/m·K that is relatively much higher than that of a conventional metal layer. Accordingly, it is possible to dissipate heat generated in the LED device to the outside through a bottom of the LED device. As a result, the LED device can be operated at a low temperature and consequently, it can have an improved reliability.

The second metal layer 241 may be provided to realize an ohmic contact property between the graphene layer 231 and the second semiconductor layer 140. A work-function of the second metal layer 241 may have an intermediate value between those of the second semiconductor layer 140 and the graphene layer 231. For example, the second metal layer 241 may have a work-function of about 4.5-7.5 eV. Accordingly, the second metal layer 241 may lower a potential barrier between the second semiconductor layer 140 and the graphene layer 231 and decrease an electric current required to operate the LED device.

According to example embodiments of the inventive concept, the graphene layer 231 may improve electric charge diffusion and heat dissipation. In addition, due to high optical transmittance of the graphene layer 231, it is possible to improve light emitting efficiency of the LED device. The second metal layer 241 may contribute to lower an electric current required to operate the LED device.

Figure 2A:
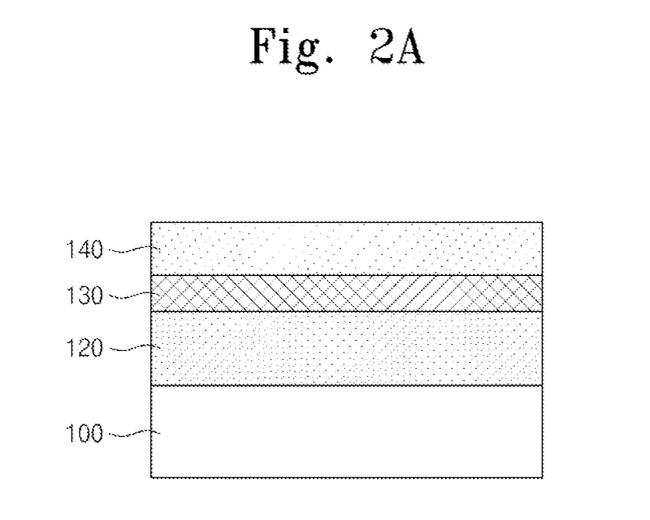
FIGS. 2A, 2B, and 2C are sectional views illustrating a method of fabricating a light emitting structure, according to example embodiments of the inventive concept.
Figure 2B:
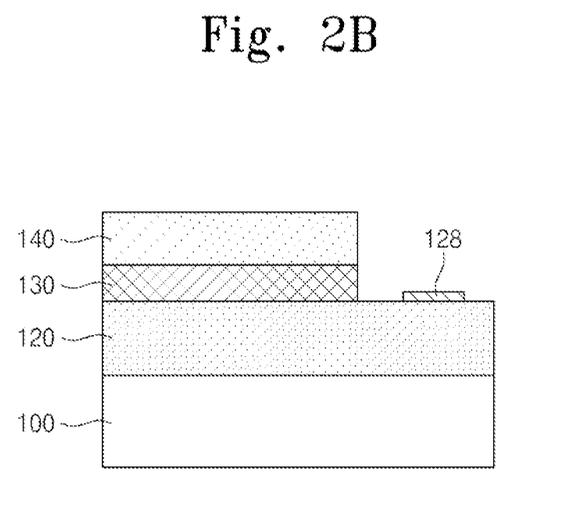
Figure 2C:
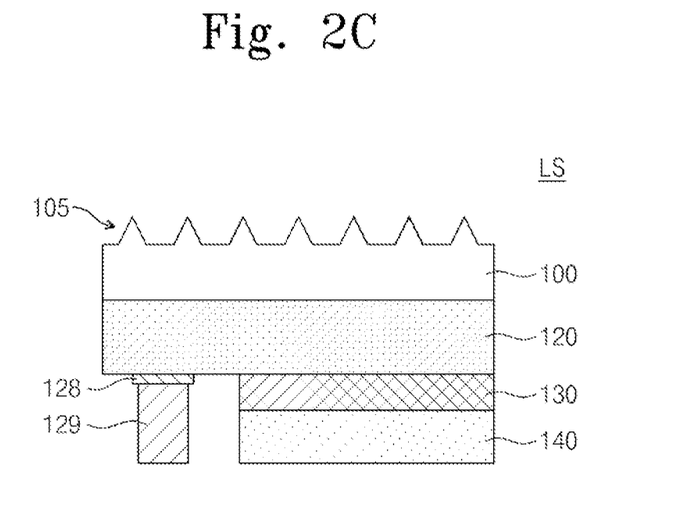

FIGS. 2A, 2B, and 2C are sectional views illustrating a method of fabricating a light emitting structure, according to example embodiments of the inventive concept.

Referring to FIG. 2A, a first semiconductor layer 120, an active layer 130, and a second semiconductor layer 140 may be sequentially formed on the second substrate 100. The second substrate 100 may be, for example, a sapphire substrate. The first semiconductor layer 120 may be an n-type clad layer. For example, the first semiconductor layer 120 may be formed of an n-type $Ga_xN_{1-x}$ layer ($0<x<1$) doped with silicon atoms. The active layer 130 may include a multi-quantum well (MQW) configured to generate photons by recombination of electrons and holes. For example, the active layer 130 may be an $In_xGa_{1-x}N$ layer ($0 \leq x<1$). The second semiconductor layer 140 may be a p-type clad layer. For example, the second semiconductor layer 140 may be a p-type $Ga_xN_{1-x}$ layer ($0<x<1$) doped with magnesium (Mg). A buffer layer (not shown) may be provided between the first semiconductor layer 120 and the second substrate 100. The first semiconductor layer 120 may be grown using the buffer layer as a seed layer. For example, the buffer layer may include at least one of $Al_xN_{1-x}$ ($0<x<1$), $Al_xGa_yN_{1-x-y}$ ($0<x<1$ and $0<y<1$), $Ga_xN_{1-x}$ ($0<x<1$), or $In_xGa_yN_{1-x-y}$ ($0<x<1$ and $0<y<1$). The first and second semiconductor layer 120 and 140 and the active layer 130 may be formed using a metal organic chemical vapor deposition (MOCVD) or a vapor-phase epitaxy (VPE).

Referring to FIG. 2B, the second semiconductor layer 140 and the active layer 130 may be etched to form a mesa-shaped structure. The mesa-etching process may be performed using an inductively-coupled-plasma (ICP) etching technique. The first semiconductor layer 120 may be exposed by the mesa-etching process. A connection pad 128 may be formed on the exposed first semiconductor layer 120. The connection pad 128 may include at least one of Ag, Al, Au, Pd, Ni, Zn, Mo, W, Cr, Ti, Eu, Pt or Mn. The connection pad 128 may be formed using an e-beam evaporation, a lift-off process, a sputtering process, or an MOCVD process.

Referring to FIG. 2C, concavo-convex patterns 105 may be formed on the second substrate 100. The formation of the concavo-convex patterns 105 may be performed in the state that the resulting structure is inverted or that the second substrate 100 faces upward. The concavo-convex patterns 105 may be formed using an ICP etching technique. An electrode connecting portion 129 may be formed below the connection pad 128. The electrode connecting portion 129 may be a solder ball, and be formed using a lift-off process or a sputtering process. The electrode connecting portion 129 may be formed before or after the formation of the concavo-convex patterns 105.

As the result of the process described with reference to FIGS. 2A, 2B, and 2C, a light emitting structure LS may be formed, and the light emitting structure LS may be mounted on a sub-mount that will be described below.

Figure 3:
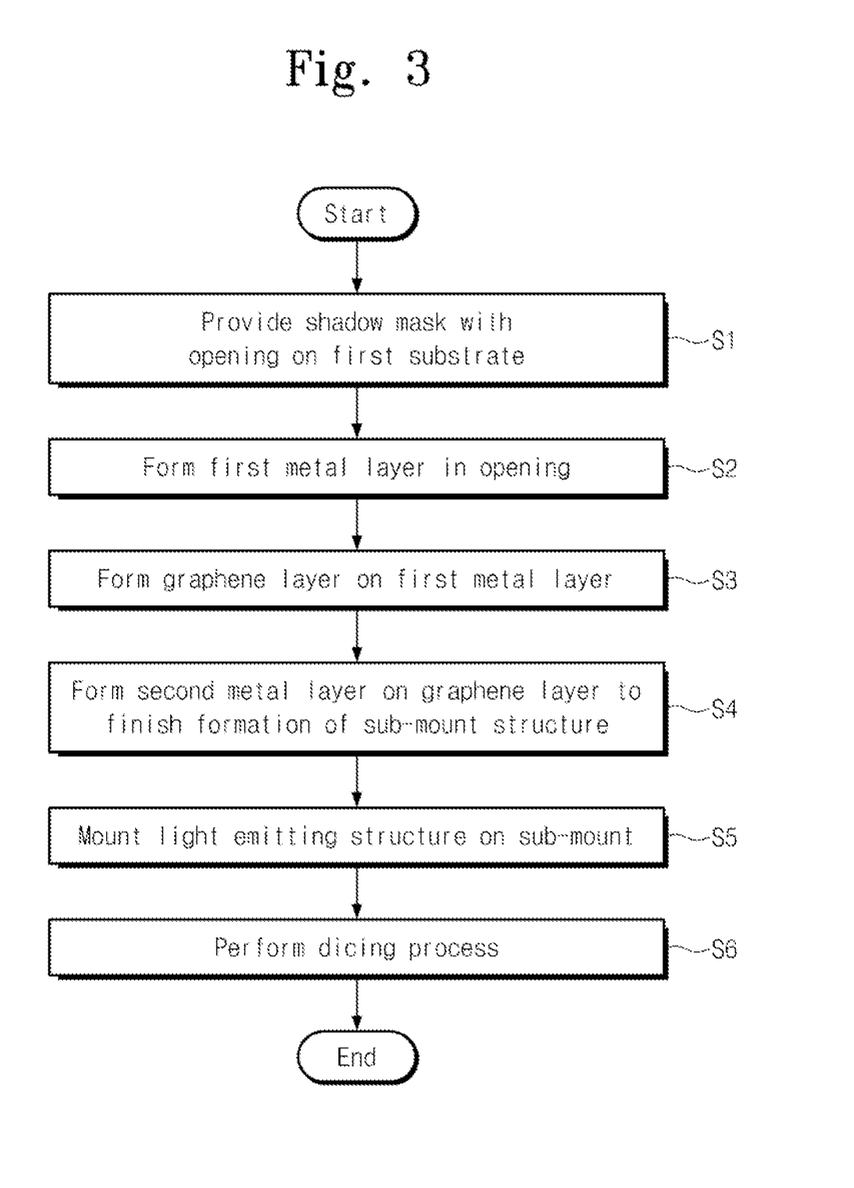
FIG. 3 is a flow chart illustrating a method of fabricating an LED device, according to example embodiments of the inventive concept.

FIG. 3 is a flow chart illustrating a method of fabricating an LED device, according to example embodiments of the inventive concept. FIGS. 4A through 9A are plan views illustrating a method of fabricating an LED device, according to example embodiments of the inventive concept, and FIGS. 4B through 9B are sectional views taken along lines I-I' of FIGS. 4A through 9A, respectively.

Figure 4A:
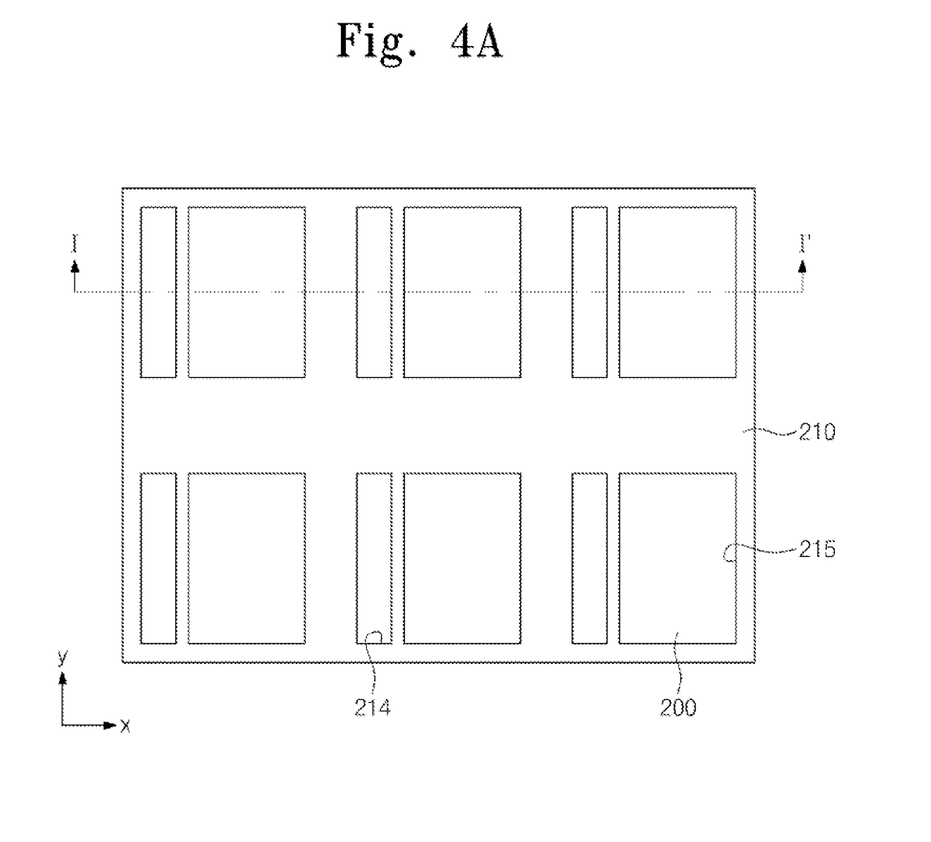
Figure 4B:
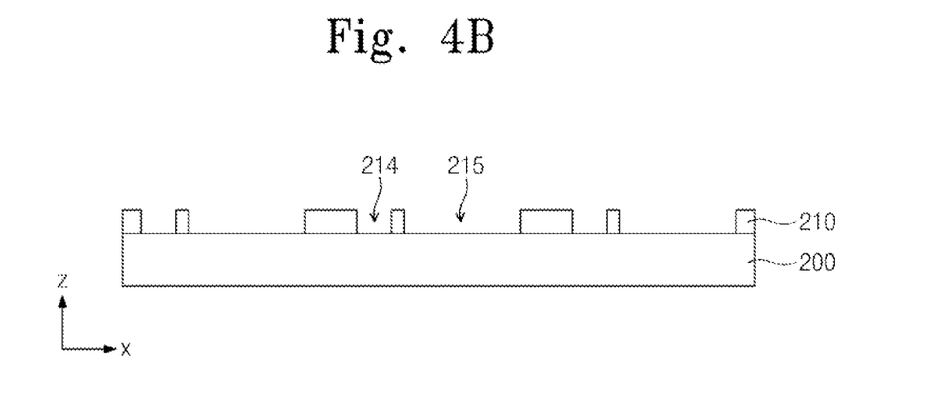

Referring to FIGS. 3, 4A and 4B, a shadow mask 210 may be provided on a first substrate 200 (in S1). The shadow mask 210 may be formed of, for example, stainless steel. The shadow mask 210 may include first openings 214 and second openings 215 that are formed to expose a top surface of the first substrate 200. An area of the first substrate 200 exposed by the first openings 214 may be smaller than that of the first substrate 200 exposed by the second openings 215.

Figure 5A:
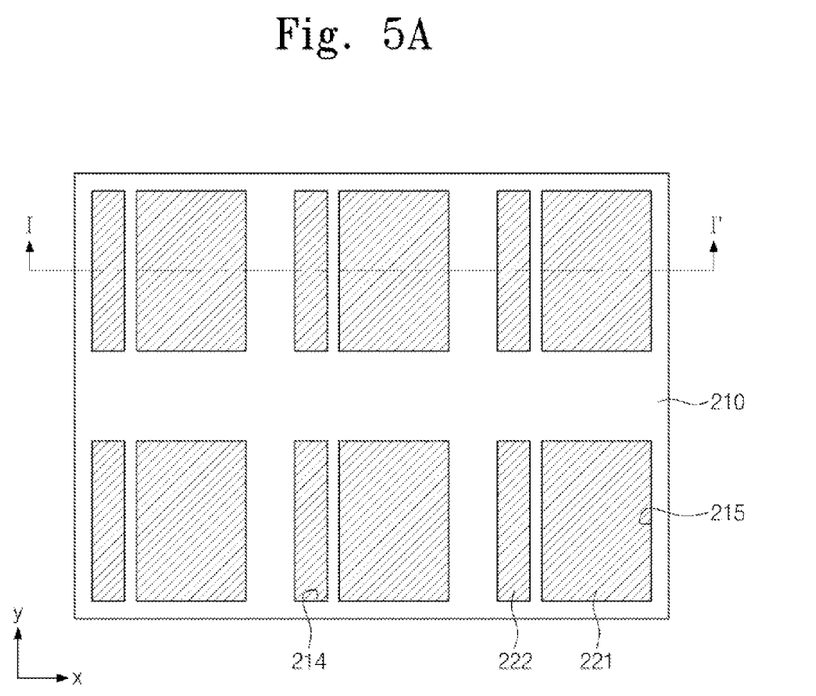
Figure 5B:
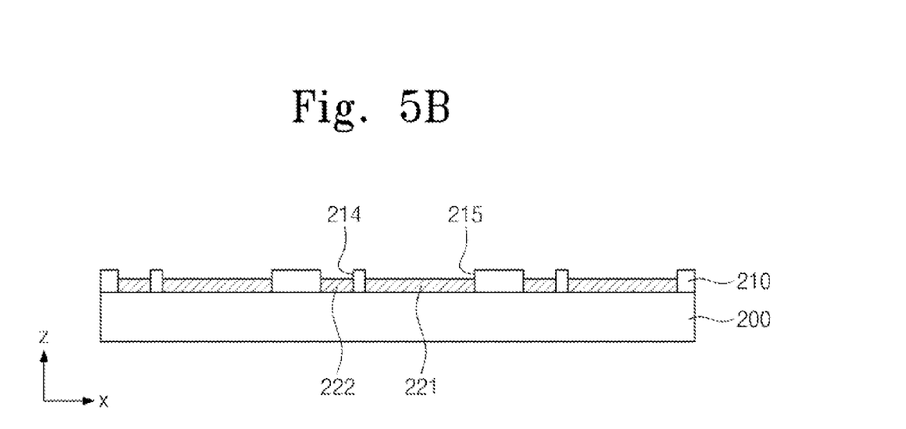

Referring to FIGS. 3, 5A, and 5B, first metal layers 221 and 222 may be formed in the openings 214 and 215 (in S2). In example embodiments, the first metal layers 221 and 222 may be formed using an electro-spinning or electro-spraying process.

Figure 11:
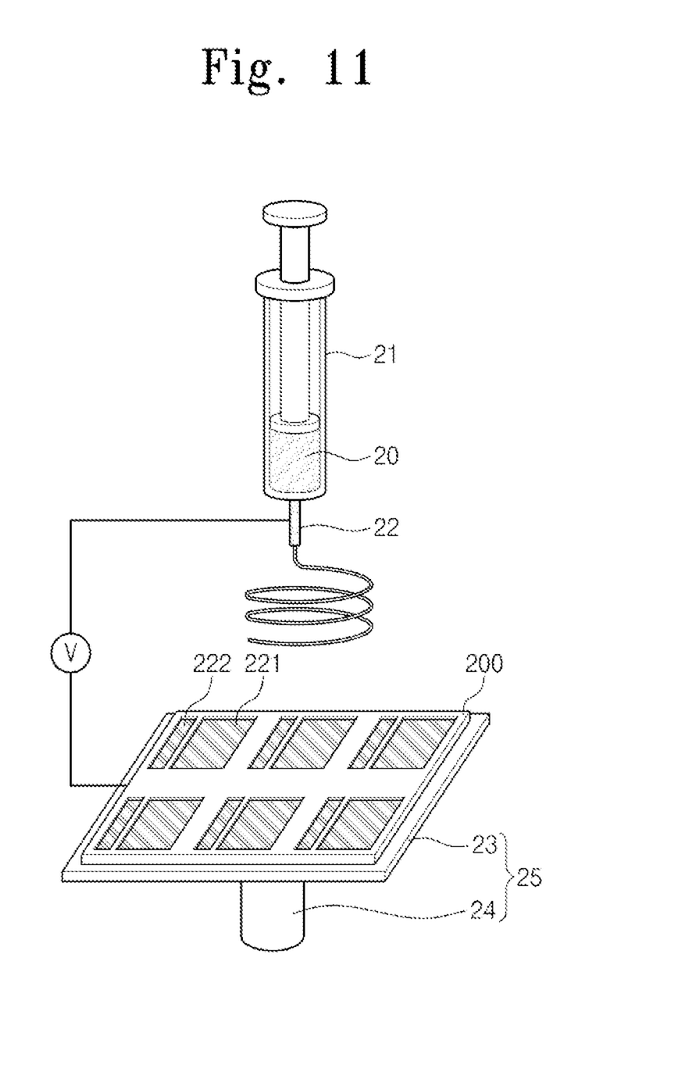
FIG. 11 is a schematic diagram illustrating an electro-spinning or electro-spraying process for forming a metal layer, according to example embodiments of the inventive concept.

Hereinafter, the electro-spinning or electro-spraying process will be described in detail with reference to FIG. 11. A collector 25 may include a bar portion 24 and a supporting part 23 on the bar portion. The first substrate 200 provided with the shadow mask may be provided on the collector 25. Metal-containing solution 20 may be provided in a cylinder 21 and be supplied onto the first substrate 200 through a nozzle 22 of the cylinder 21. A predetermined voltage may be applied between the cylinder 21 and the collector 25. The solution 20 may include metal particles (e.g., of nickel (Ni) or copper (Cu)). A mean diameter of the metal particles may range from about 10 nm to about 100 nm. The solution 20 may contain solvent, which may be at least one of di-ethylene glycol (41.8-43.5 cPs), terpineol (36.6 cPs), ethylene glycol (24.0 cPs), di-ethylene glycol mono-benzyl ether (19.3 cPs), propylene glycol mono-phenyl ether (23.2 cPs), glycerol (300 cPs), propylene glycol (41.7 cPs), or tri-ethylene glycol (36.1 cPs). The solution 20 may be prepared to have viscosity suitable for the electro-spinning or electro-spraying process (for example, of about 10-50 cPs). After the formation of the first metal layers 221 and 222, the shadow mask 210 may be removed.

In other example embodiments, the first metal layers 221 and 222 may be formed using an e-beam evaporation, a lift-off process, a sputtering process, or an MOCVD process.

Figure 6A:
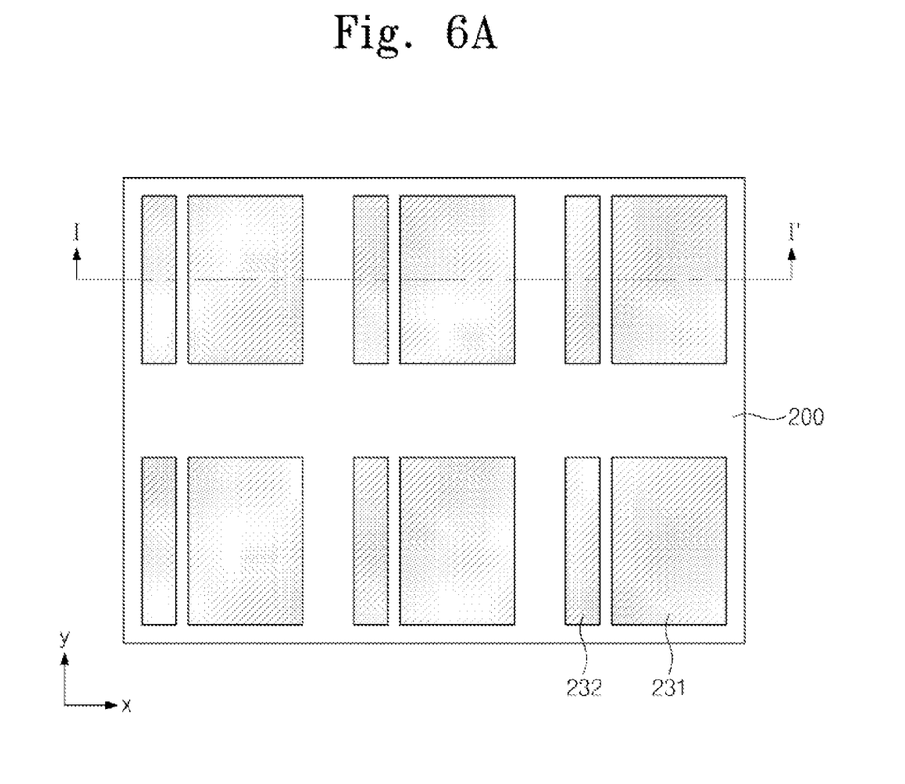
Figure 6B:
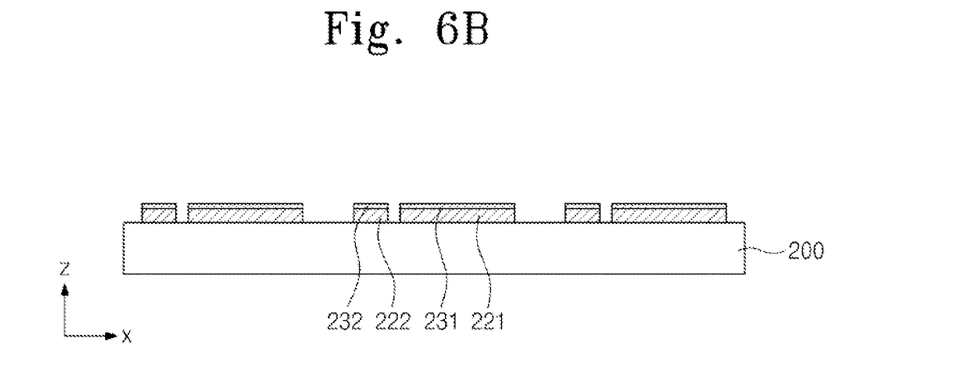

Referring to FIGS. 3, 6A, and 6B, graphene layers 231 and 232 may be formed on the first metal layers 221 and 222 (in S3). The formation of the graphene layers 231 and 232 may be performed by, for example, a chemical vapor deposition process, in which the first metal layers 221 and 222 are used as a catalysis layer. As a result, the graphene layers 231 and 232 may be selectively formed on the first metal layers 221 and 222.

Hereinafter, a process of forming the graphene layers 231 and 232 will be described in detail. The first substrate 200 provided with the first metal layers 221 and 222 may be loaded in a CVD chamber, and then, source gas containing CH4, H2, and/or Ar may be supplied into the CVD chamber in a temperature of about 800-900° C. In the chamber, carbon atoms may be thermally decomposed from CH4, be absorbed into or adsorbed onto the first metal layers 221 and 222. Thereafter, if the first substrate 200 is cooled, such that carbon atoms absorbed in the first metal layers 221 and 222 may be crystallized on surfaces of the first metal layers 221 and 222 to form a graphene crystal structure.

Figure 7A:
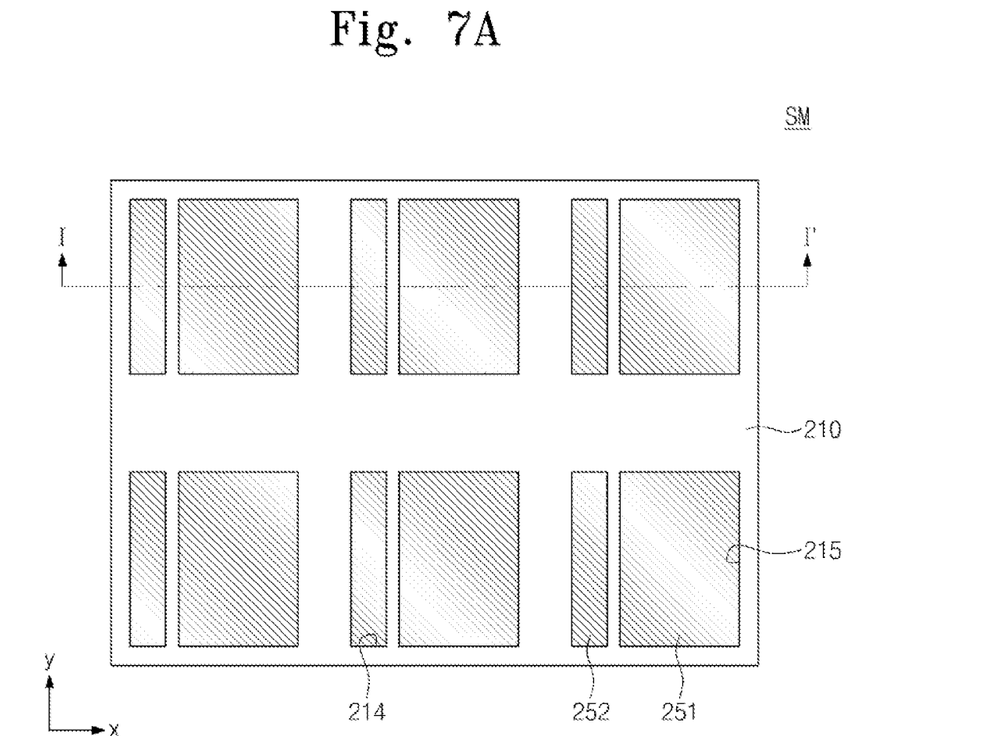
Figure 7B:
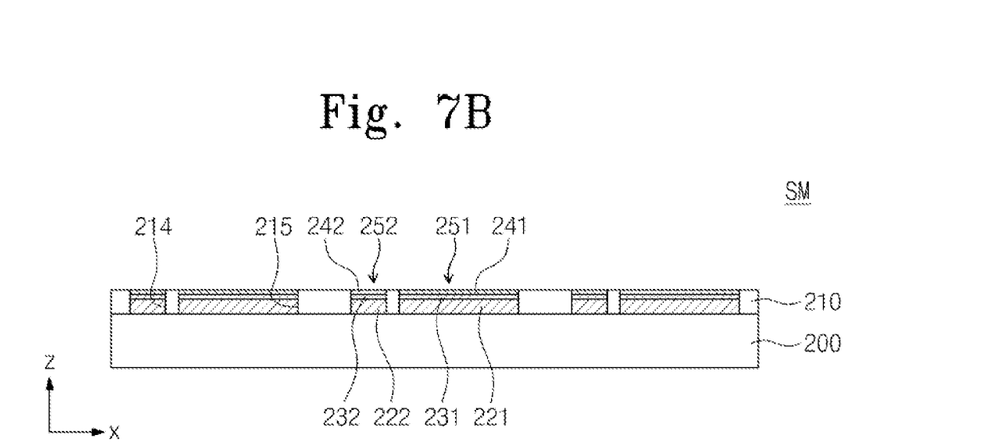

Referring to FIGS. 3, 7A, and 7B, second metal layers 241 and 242 may be formed on the graphene layers 231 and 232 (in S4). The second metal layers 241 and 242 may be formed using, for example, the electro-spinning or electro-spraying process described with reference to FIG. 11. For example, the formation of the second metal layers 241 and 242 may include disposing the shadow mask 210 on the first substrate 200 provided with the graphene layers 231 and 232 again, and performing the electro-spinning or electro-spraying process. The second metal layers 241 and 242 may be formed to have a thickness that is relatively smaller than that of the first metal layers 221 and 222 and to have a mesh-shaped structure by using the electro-spinning or electro-spraying process. Accordingly, the second metal layers 241 and 242 may have high optical transmittance. The second metal layers 241 and 242 may be formed using solution including metal particles, which may be at least one of zinc (Zn), indium (In), titanium (Ti), tin (Sn), copper (Cu), or antimony (Sb). As the result of the formation of the second metal layers 241 and 242, a sub-mount SM with first electrode portions 252 and second electrode portions 251 may be formed. Next, the shadow mask 210 may be removed.

Figure 8A:
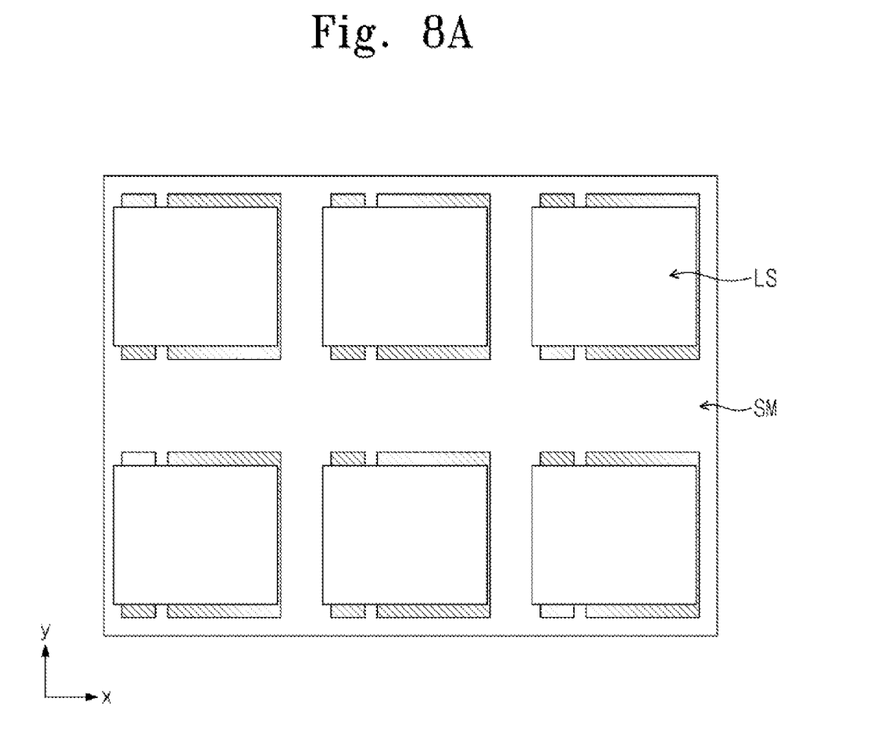
Figure 8B:
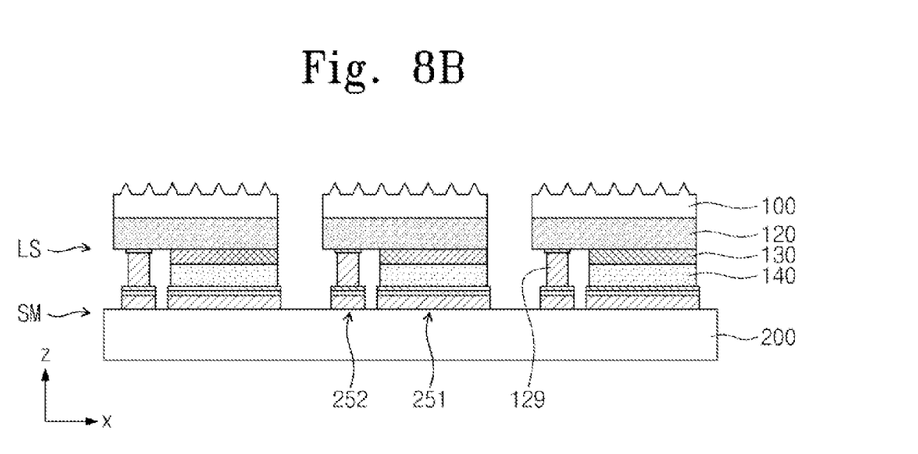

Referring to FIGS. 3, 8A, and 8B, light emitting structures LS may be mounted on the sub-mount SM (in S5). The light emitting structures LS may be mounted on the sub-mount SM in a flip-chip manner (for example, in a state that the second substrate 100 is disposed on the active layer 130). The light emitting structures LS may be the light emitting structures fabricated by the method described with reference to FIGS. 2A through 2C. The second semiconductor layers 140 of the light emitting structures LS may be disposed on the second electrode portions 251, and the electrode connecting portions 129 may be disposed on the first electrode portions 252. The light emitting structures LS may be provided on the sub-mount SM, and then, a thermal treatment process may be performed thereto. In example embodiments, the thermal treatment process may be performed at a temperature of about 50-100° C. in about 30 minutes. As the result of the thermal treatment process, the second metal layers 241 and 242 may be attached to the second semiconductor layers 140 and the electrode connecting portions 129, respectively. In other example embodiments, the light emitting structures LS may be attached to the sub-mount SM using an additional conductive adhesion layer.

Figure 9A:
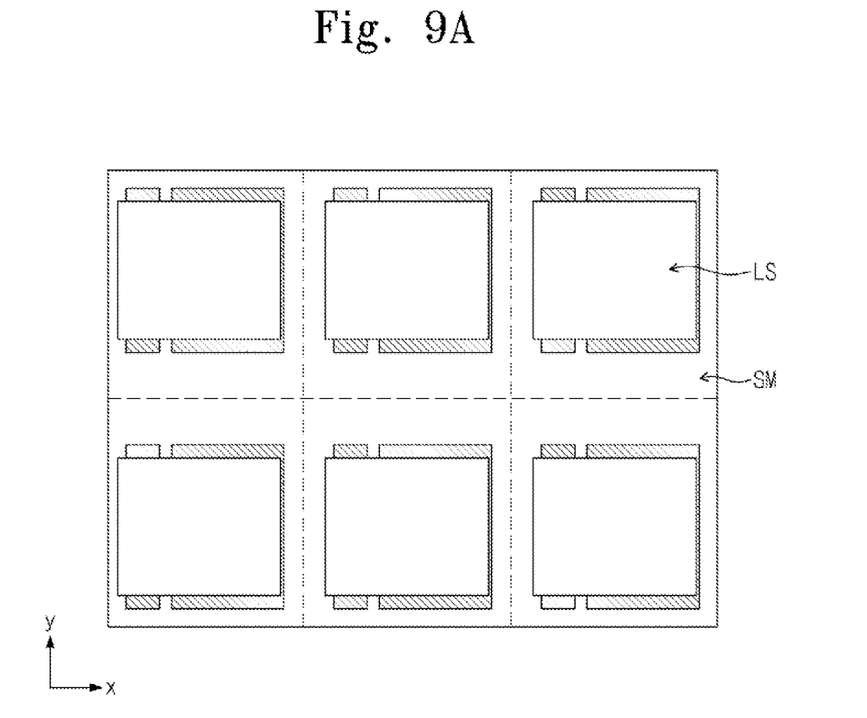
Figure 9B:
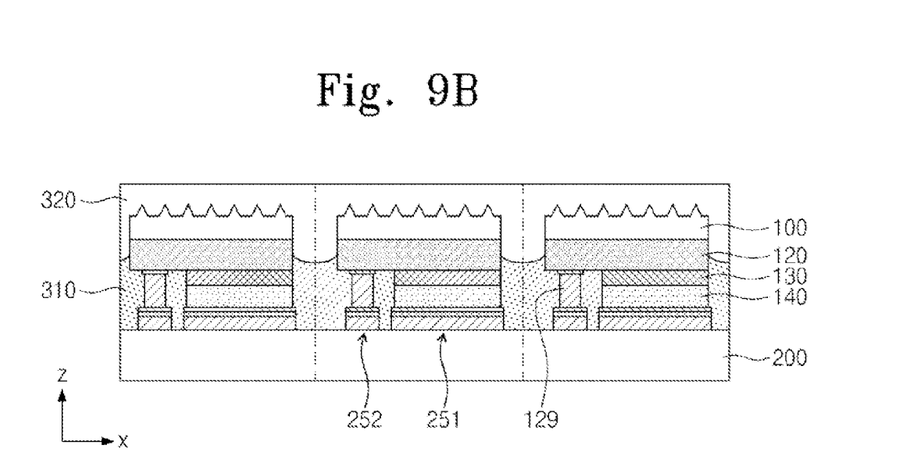

Referring to FIGS. 3, 9A, and 9B, a dicing process may be performed to separate the light emitting structures LS mounted on the sub-mount SM into individual LED devices (in S6). Before the dicing process, an under-fill layer 310 may be formed to fill a gap between the light emitting structures LS. The under-fill layer 310 may be, for example, a silicon resin. An encapsulating resin layer 320 may be formed on the under-fill layer 310 to cover the light emitting structures LS. The encapsulating resin layer 320 may be a layer containing a fluorescent material.

According to example embodiments of the inventive concept, a graphene layer may be used as a part of an electrode of the LED device, without a transfer process and/or a patterning process. In the case where the graphene layer is formed using a conventional process, a patterning process may be performed using a photoresist layer after the formation of the graphene layer. Due to the strong binding force between the graphene layer and the photoresist layer, the graphene layer may be detached, during a process of removing the photoresist layer. By contrast, in the method fabricating according to example embodiments of the inventive concept, the sub-mount structure may be formed to have a triple-layer structure of metal-graphene-metal, which serves as an electrode of the LED device. Accordingly, the graphene layer may be used as the electrode of the LED device, without additional transfer process and/or a patterning process.

Figure 10A:
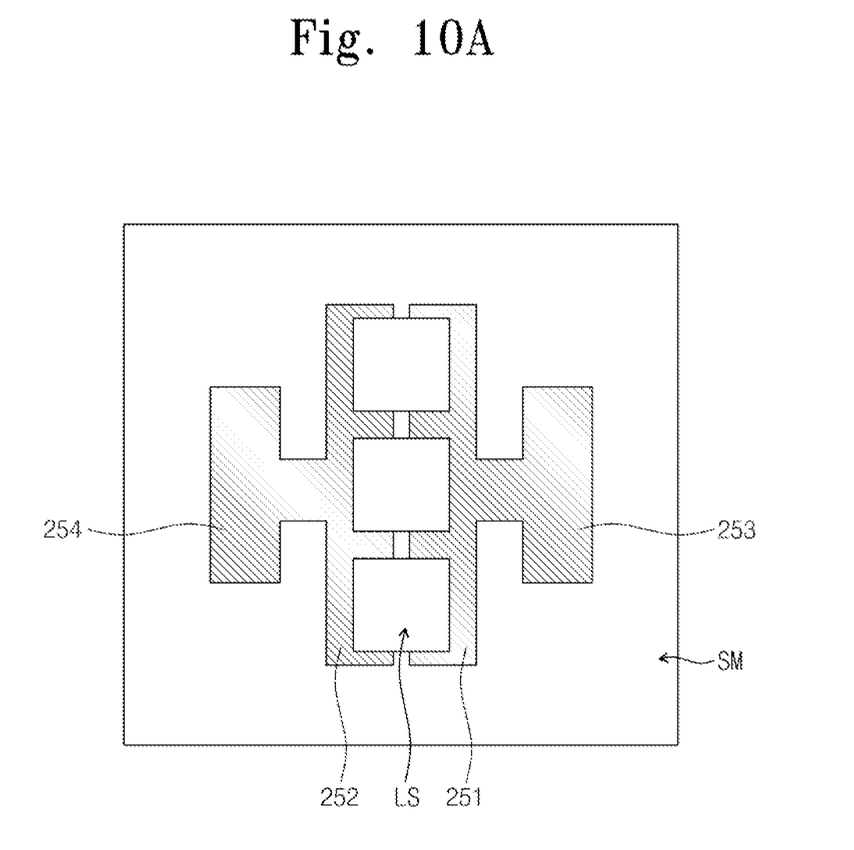
FIGS. 10A and 10B are plan views illustrating sub-mount structures according to other example embodiments of the inventive concept.
Figure 10B:
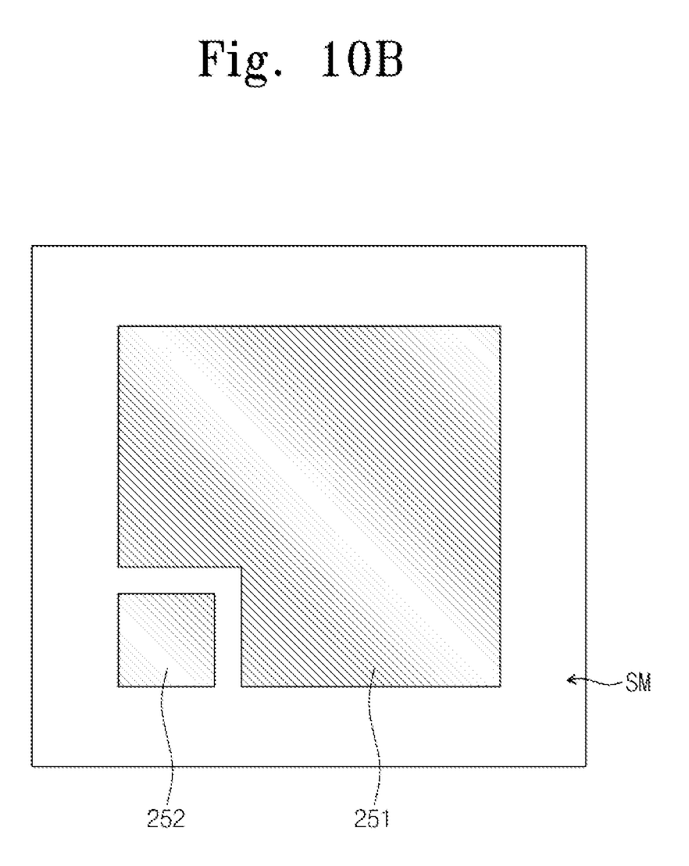

FIGS. 10A and 10B are plan views illustrating sub-mount structures according to other example embodiments of the inventive concept. For the sake of brevity, the elements and features of this example that are similar to those previously shown and described will not be described in much further detail.

Referring to FIG. 10A, a plurality of light emitting structures LS may be connected to one of the first electrode portions 252 and one of the second electrode portions 251. Accordingly, the plurality of the light emitting structures LS may be simultaneously operated by a voltage generated between the first electrode portion 252 and the second electrode portion 251. A first connection pad 254 may be provided at and extended from a side of the first electrode portion 252, and a second connection pad 253 may be provided at and extended from a side of the second electrode portion 251. The first and second connection pads 253 and 254 may serve as terminals, to which an external power can be applied. The first and second connection pads 253 and 254 may be formed of the same layer as the electrode portions 251 and 252. For example, the first and second connection pads 253 and 254 may include a graphene layer, and they may be formed to have relatively large areas. Accordingly, heat from the LEDs can be dissipated to the outside through the graphene layer with ease.

Shapes of the electrode portions 251 and 252 may be variously modified depending on the shape of the light emitting structure LS. For example, as shown in FIG. 10B, the second electrode portion 251 may have two inner sides that face the corresponding two sides of the first electrode portion 252.

According to example embodiments of the inventive concept, a graphene layer is provided as a portion of an electrode, and this used of the graphene layer enables to improve light emitting and heat-dissipating efficiency of LED devices. In addition, since there is no need to perform a transfer process of the graphene layer, the electrode of the LED device can be realized using a damage-free graphene layer.

While example embodiments of the inventive concepts have been particularly shown and described, it will be understood by one of ordinary skill in the art that variations in form and detail may be made therein without departing from the spirit and scope of the attached claims.

What is claimed is:
1. A light emitting diode (LED), comprising:
a sub-mount structure including a first substrate and electrode portions provided on the first substrate; and
a light emitting structure mounted on the sub-mount structure to include a first semiconductor layer, a second semiconductor layer, and an active layer between the first semiconductor layer and the second semiconductor layer, wherein the electrode portions comprise a first electrode portion and a second electrode portion connected to the first and second semiconductor layers, respectively, and each of the first and second electrode portions comprises a first metal layer, a graphene layer, and a second metal layer sequentially provided on the first substrate.

2. The LED of claim 1, wherein the light emitting structure further comprises a second substrate on the first semiconductor layer, and an upper portion of the second substrate is formed to have concavo-convex patterns.

3. The LED of claim 2, wherein the light emitting structure further comprises an electrode connecting portion connecting a bottom surface of the first semiconductor layer to the first electrode portion.

4. The LED of claim 1, wherein the second metal layer is a mesh-shaped transparent electrode.

5. The LED of claim 4, wherein the second metal layer is thinner than the first metal layer.

6. The LED of claim 1, wherein the light emitting structure comprises a plurality of light emitting structures, the first semiconductor layers of the plurality of the light emitting structures are connected in common to the first electrode portion, the second semiconductor layers of the plurality of the light emitting structures are connected in common to the second electrode portion.

7. The LED of claim 6, wherein the sub-mount structure further comprises connection pads extending from the first and second electrode portions, respectively.

* * * * *